United States Patent
Okumura et al.

(10) Patent No.: US 9,960,096 B2
(45) Date of Patent: *May 1, 2018

(54) SEMICONDUCTOR DEVICE

(71) Applicants: DENSO CORPORATION, Kariya, Aichi-pref. (JP); TOYOTA JIDOSHA KABUSHIKI KAISHA, Toyota-shi, Aichi-ken (JP)

(72) Inventors: Tomomi Okumura, Kariya (JP); Takuya Kadoguchi, Toyota (JP)

(73) Assignees: DENSO CORPORATION, Kariya (JP); TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 14/917,618

(22) PCT Filed: Sep. 9, 2014

(86) PCT No.: PCT/JP2014/004617
§ 371 (c)(1),
(2) Date: Mar. 9, 2016

(87) PCT Pub. No.: WO2015/037221
PCT Pub. Date: Mar. 19, 2015

(65) Prior Publication Data
US 2016/0218047 A1    Jul. 28, 2016

(30) Foreign Application Priority Data
Sep. 16, 2013  (JP) ................................. 2013-191255

(51) Int. Cl.
H01L 23/051    (2006.01)
H01L 23/367    (2006.01)
(Continued)

(52) U.S. Cl.
CPC ........ *H01L 23/3672* (2013.01); *H01L 23/051* (2013.01); *H01L 23/3114* (2013.01);
(Continued)

(58) Field of Classification Search
CPC ........... H01L 23/3672; H01L 23/49562; H01L 23/051; H01L 23/49568; H01L 23/49575;
(Continued)

(56) References Cited

U.S. PATENT DOCUMENTS

2005/0056927 A1    3/2005  Teshima et al.
2006/0145335 A1    7/2006  Teshima et al.
(Continued)

FOREIGN PATENT DOCUMENTS

JP    2009-164647 A    7/2009
JP    2013-101993 A    5/2013
(Continued)

OTHER PUBLICATIONS

International Search Report of the International Searching Authority dated Dec. 16, 2014 issued in the corresponding International application No. PCT/JP2014/004617 (and English translation).
(Continued)

*Primary Examiner* — Jarrett Stark
(74) *Attorney, Agent, or Firm* — Posz Law Group, PLC

(57) ABSTRACT

In a semiconductor device, a second heat sink and a third heat sink are electrically connected by a joint portion in an alignment direction in which a first switching element and a second switching element are aligned. A second power-supply terminal is disposed in the alignment direction in a region between a first power-supply terminal and an output terminal and between the second heat sink and the third heat sink. In an encapsulation resin body, at least one of a shortest distance between a first potential portion at same potential as the first power-supply terminal and a third potential portion
(Continued)

at same potential as the output terminal and a shortest distance between a second potential portion at same potential as the second power-supply terminal and the third potential portion is shorter than a shortest distance between the first potential portion and the second potential portion.

9 Claims, 5 Drawing Sheets

(51) Int. Cl.
  H01L 25/07 (2006.01)
  H01L 25/18 (2006.01)
  H01L 23/00 (2006.01)
  H01L 23/31 (2006.01)
  H01L 23/433 (2006.01)
  H01L 23/495 (2006.01)

(52) U.S. Cl.
  CPC .... *H01L 23/4334* (2013.01); *H01L 23/49562* (2013.01); *H01L 23/49568* (2013.01); *H01L 23/49575* (2013.01); *H01L 24/33* (2013.01); *H01L 25/07* (2013.01); *H01L 25/18* (2013.01); *H01L 23/3107* (2013.01); *H01L 2924/13055* (2013.01); *H01L 2924/181* (2013.01)

(58) Field of Classification Search
  CPC . H01L 23/4334; H01L 23/3114; H01L 24/33; H01L 25/18; H01L 25/07; H01L 23/3107
  See application file for complete search history.

(56) References Cited

U.S. PATENT DOCUMENTS

| | | |
|---|---|---|
| 2008/0224643 A1 | 9/2008 | Sakurai et al. |
| 2009/0257212 A1 | 10/2009 | Takano et al. |
| 2011/0297964 A1 | 12/2011 | Miura |
| 2012/0001308 A1* | 1/2012 | Fukutani .......... H01L 23/49524 257/675 |
| 2013/0021749 A1 | 1/2013 | Nakajima |
| 2013/0062751 A1 | 3/2013 | Takagi et al. |
| 2014/0035112 A1* | 2/2014 | Kadoguchi ....... H01L 23/49548 257/666 |
| 2014/0159216 A1* | 6/2014 | Ishino ................. H01L 23/4006 257/675 |
| 2014/0264819 A1* | 9/2014 | Okumura .......... H01L 23/49562 257/712 |
| 2014/0374895 A1 | 12/2014 | Kadoguchi et al. |
| 2015/0028466 A1* | 1/2015 | Kadoguchi ........... H01L 23/051 257/676 |
| 2015/0162274 A1* | 6/2015 | Kadoguchi ........... H01L 23/047 257/694 |
| 2016/0163615 A1* | 6/2016 | Mitamura .......... H01L 27/0664 257/140 |
| 2016/0218047 A1* | 7/2016 | Okumura ................ H01L 25/07 |
| 2016/0315037 A1* | 10/2016 | Kadoguchi ....... H01L 23/49562 |
| 2016/0336251 A1* | 11/2016 | Fukuoka ............ H01L 29/7395 |
| 2017/0018484 A1* | 1/2017 | Kadoguchi ......... H01L 23/4334 |
| 2017/0092559 A1* | 3/2017 | Iwasaki ............... H01L 23/3675 |

FOREIGN PATENT DOCUMENTS

| | | |
|---|---|---|
| JP | 2013-149684 A | 8/2013 |
| JP | 2014-154780 A | 8/2014 |
| JP | 5739956 B2 | 5/2015 |

OTHER PUBLICATIONS

Written Opinion of the International Searching Authority dated Dec. 16, 2014 issued in the corresponding International application No. PCT/JP2014/004617 (and English translation).

* cited by examiner

SEMICONDUCTOR DEVICE

CROSS REFERENCE TO RELATED APPLICATION

This application is a U.S. national stage of International Application No. PCT/JP2014/004617 filed on Sep. 9, 2014 and is based on Japanese Patent Application No. 2013-191255 filed on Sep. 16, 2013, the disclosures of which are incorporated herein by reference.

TECHNICAL FIELD

The present disclosure relates to a semiconductor device including a first switching element and a second switching element forming upper and lower arms, heat sinks disposed on both sides of the respective switching elements, a joint portion electrically connecting the upper arm and the lower arm, and an encapsulation resin body in which the respective switching elements, the respective heat sinks, and the joint portion are encapsulated.

BACKGROUND ART

According to a semiconductor device described in Patent Literature 1, thick plate portions (heat sinks) are disposed on both sides of a first semiconductor element and a second semiconductor element (switching elements), and an upper arm and a lower arm are electrically connected by thin plate portions (joint portion). The respective semiconductor elements, thick plate portions, and thin plate portions are encapsulated in encapsulation resin (encapsulation resin body).

PRIOR ART LITERATURE

Patent Literature

Patent Literature 1: JP2012-235081A (corresponding to US 2014/0035112A1)

SUMMARY OF INVENTION

In the semiconductor device described in Patent Literature 1, an output terminal is disposed between power-supply terminals, namely, a high-potential power-supply terminal and a low-potential power-supply terminal, in an alignment direction in which the first semiconductor element and the second semiconductor element are aligned. The output terminal is also positioned in the alignment direction so as to overlap the thick plate portion provided with the low-potential power-supply terminal.

In the case of the semiconductor device described above, the thick plate portions, which are disposed on the sides of mutually different surfaces of the encapsulation resin, have to be connected by the joint portion in order to electrically connect the upper arm and the lower arm. Hence, the joint portion is disposed in the alignment direction in a region between the upper arm and the lower arm, that is, between the first semiconductor element and the second semiconductor element. A space in which to connect the upper arm and the lower arm by the joint portion is therefore necessary in the alignment direction. A physical size of the semiconductor device may be reduced by disposing any one of the high-potential power-supply terminal, the low-potential power-supply terminal, and the output terminal in the space in which the joint portion is disposed.

Alternatively, the high-potential power-supply terminal and the low-potential power-supply terminal may be installed next to each other in the alignment direction by disposing one of the high-potential power-supply terminal and the low-potential power-supply terminal in the space in which the joint portion is disposed. The configuration above can enhance an effect of cancelling out magnetic fluxes from the respective terminals. Consequently, parasitic inductance is reduced and hence a surge voltage occurring when the semiconductor elements switch can be reduced.

However, when one of the high-potential power-supply terminal and the low-potential power-supply terminal is disposed in the space in which the joint portion is disposed, a high-potential portion having the same potential as the high-potential power-supply terminal and a low-potential portion having the same potential as the low-potential power-supply terminal are located in close proximity to each other in the encapsulation resin. Under such conditions, when insulation performance of the encapsulation resin deteriorates due to aging or the like, the high-potential portion and the low-potential portion may be electrically connected via the encapsulation resin to allow a large short-circuit current to flow.

In the semiconductor device described above, operations of the respective semiconductor elements are generally controlled by a protection circuit in such a manner that when a short circuit occurs between electrodes of one of the first semiconductor element and the second semiconductor element, the other one is restricted from being turned on. However, when the low-potential portion is located in close proximity to the high-potential portion and the insulation performance of the encapsulation resin deteriorates, a short circuit occurs between the high-potential portion and the low-potential portion via the encapsulation resin even in the presence of the protection circuit.

In view of the foregoing problems, the present disclosure has an object to provide a semiconductor device which is capable of reducing a surge voltage while reducing a size in an alignment direction of switching elements and hardly causes a short circuit even when insulation performance of an encapsulation resin body deteriorates.

According to an aspect of the present disclosure, a semiconductor device includes a first switching element having electrodes on both upper and lower surfaces and a second switching element having electrodes on both upper and lower surfaces as switching elements forming upper and lower arms, and the first switching element and the second switching element are disposed in parallel and controlled in such a manner that when a short circuit occurs between the electrodes of one of the first switching element and the second switching element, the other one is restricted from being turned on. The semiconductor device further includes: heat sinks electrically connected to the switching elements, including a first heat sink electrically connected to the electrode on the lower surface of the first switching element, a second heat sink electrically connected to the electrode on the upper surface of the first switching element, a third heat sink electrically connected to the electrode on the lower surface of the second switching element, and a fourth heat sink electrically connected to the electrode on the upper surface of the second switching element; a joint portion provided to at least one of the second heat sink and the third heat sink to electrically join the second heat sink and the third heat sink; an encapsulation resin body in which the respective switching elements, the respective heat sinks, and the joint portion are integrally encapsulated; a first power-supply terminal provided to extend from the first heat sink in a direction orthogonal to both of an alignment direction in which the first switching element and the second switching element are aligned and a thickness direction of the first switching element and exposed to an outside of the encapsulation resin body; an external connection output terminal provided to extend from the third heat sink in a same direction as the first power-supply terminal extends and exposed to the outside of the encapsulation resin body; and a second power-supply terminal having an encapsulated portion electrically connected to the fourth heat sink and encapsulated in the encapsulation resin body and an exposed portion provided to extend from the encapsulated portion in a same direction as the first power-supply terminal extends and exposed to the outside of the resin encapsulation body, the second power-supply terminal being connected to a power supply together with the first power-supply terminal. The second power-supply terminal is disposed in the alignment direction in a region between the first power-supply terminal and the output terminal and between the second heat sink and the third heat sink. In the encapsulation resin body, a portion at same potential as the first power-supply terminal is referred to as a first potential portion, a portion at same potential as the second power-supply terminal is referred to as a second potential portion, and a portion at same potential as the output terminal is referred to as a third potential portion. At least one of a shortest distance between the first potential portion and the third potential portion and a shortest distance between the second potential portion and the third potential portion is shorter than a shortest distance between the first potential portion and the second potential portion.

In the configuration to electrically connect the second heat sink disposed adjacent to the upper surface of the switching elements and the third heat sink disposed adjacent to the lower surface of the switching element by the joint portion, the second power-supply terminal is disposed in a region between the second heat sink and the third heat sink. In short, the second power-supply terminal is disposed in a region in which the upper arm and the lower arm are connected. A physical size of the semiconductor device can be therefore reduced in the alignment direction.

Also, a current flows in opposite directions in the first power-supply terminal and the second power-supply terminal. Hence, by disposing the second power-supply terminal next to the first power-supply terminal, an effect of cancelling out magnetic fluxes can be enhanced. Consequently, parasitic inductance is reduced and hence a surge voltage occurring when the switching elements switch can be reduced.

As has been described above, the second power-supply terminal is disposed in the alignment direction in a region between the second heat sink and the third heat sink. Hence, the encapsulated portion of the second power-supply terminal is in closer proximity to the first heat sink. However, at least one of a shortest distance between the first potential portion and the third potential portion and a shortest distance between the second potential portion and the third potential portion is made shorter than a shortest distance between the first potential portion and the second potential portion. Accordingly, when insulation performance of the encapsulation resin body deteriorates, a short circuit is more likely to occur between the first potential portion and the third potential portion or between the second potential portion and the third potential portion than between the first potential portion and the second potential portion. Hence, a large short-circuit current that flows due to a short circuit occurring between the first potential portion and the second potential portion via the encapsulation resin body can be restricted. Herein, the first switching element and the second switching element are controlled in such a manner that when a short circuit occurs between the electrodes of one of the first switching element and the second switching element, the other one is restricted from being turned on. Consequently, a large short-circuit current that flows due to a short circuit occurring between the first potential portion and the second potential portion can be restricted even when a short circuit occurs between the first potential portion and the third potential portion or between the second potential portion and the third potential portion.

BRIEF DESCRIPTION OF DRAWINGS

The above and other objects, features and advantages of the present disclosure will become more apparent from the following detailed description made with reference to the accompanying drawings, in which.

DESCRIPTION OF EMBODIMENTS

Figure 1:
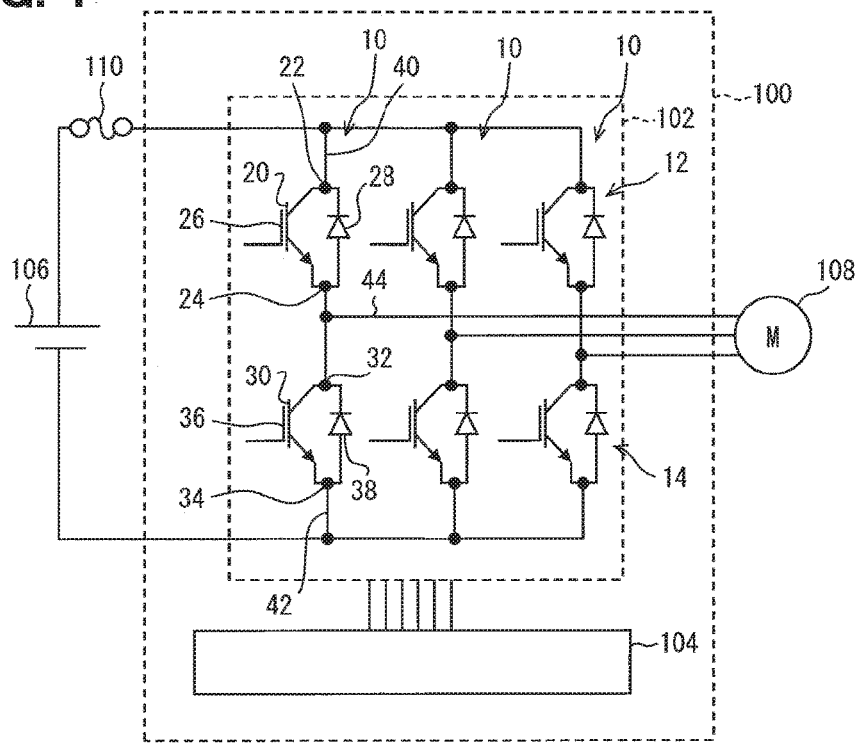
FIG. 1 is a circuit diagram schematically showing a configuration of a power conversion device to which a semiconductor device according to a first embodiment is applied.

Hereinafter, embodiments of the present disclosure will be described with reference to the drawings. Same or equivalent portions in the respective drawings are labeled with same reference numerals. In the following description, a thickness direction of an IGBT element as a switching element is referred to as a Z direction. A direction orthogonal to the Z direction and in which two IGBTs forming upper and lower arms are aligned is referred to as an X direction. A direction orthogonal to both of the X direction and the Z direction is referred to as a Y direction. A planar shape means a shape along a plane defined by the X direction and the Y direction.

First Embodiment

A power conversion device to which a semiconductor device of the present embodiment is applied will be described first according to FIG. 1.

As is shown in FIG. 1, a power conversion device 100 includes an inverter portion 102 made up of three semiconductor devices 10, and a control portion 104 which controls an operation of the inverter portion 102.

Each semiconductor device 10 has an upper arm portion 12 and a lower arm portion 14 connected to each other in series between a positive electrode and a negative electrode of a DC power supply 106. The inverter portion 102 is capable of converting DC power to a three-phase AC and outputting the three-phase AC, for example, to a motor 108. The power conversion device 100 configured as above is equipped, for example, to an electric car or a hybrid car. A fuse 110 is provided between the positive electrode of the DC power supply 106 and the inverter portion 102 with the aim of providing protection against an overcurrent.

The upper arm portion 12 includes an n-channel IGBT element 20 and a freewheel FWD element 28 connected in anti-parallel with the IGBT element 20. The lower arm 14 includes an n-channel IGBT element 30 and a freewheel FWD element 38 connected in anti-parallel with the IGBT element 30. In the present embodiment, the IGBT element 20 of the upper arm portion 12 corresponds to a first switching element and the IGBT element 30 of the lower arm portion 14 corresponds to a second switching element.

The IGBT element 20 has a collector electrode 22, an emitter electrode 24, and a gate electrode 26. Likewise, the IGBT element 30 has a collector electrode 32, an emitter electrode 34, and a gate electrode 36.

The semiconductor device 10 has external connection terminals, namely, a high-potential power-supply terminal 40 (so-called P terminal), a low-potential power-supply terminal 42 (so-called N terminal), an output terminal 44 (so-called O terminal), and control terminals 46. In the present embodiment, the high-potential power-supply terminal 40 corresponds to a first power-supply terminal and the low-potential power-supply terminal 42 corresponds to a second power-supply terminal.

The collector electrode 22 of the IGBT element 20 together with a cathode electrode of the FWD element 28 is electrically connected to the positive electrode of the DC power supply 106 via the high-potential power-supply terminal 40. Meanwhile, the emitter electrode 34 of the IGBT element 30 together with an anode electrode of the FWD element 38 is electrically connected to the negative electrode of the DC power supply 106 via the low-potential power-supply terminal 42.

The emitter electrode of the IGBT element 20 and an anode electrode of the FWD element 28 are connected to the collector electrode 32 of the IGBT element 30 and a cathode electrode of the FWD element 38. The connection point is electrically connected to the motor 108 via the output terminal 44. One gate terminal 46g included in the control terminals 46 is connected to the gate electrode 26 of the IGBT element 20 and another gate terminal 46g is connected to the gate electrode 36 of the IGBT element 30.

The control portion 104 is electrically connected to the gate terminals 46g and controls the IGBT elements 20 and 30 to switch ON and OFF. The control portion 104 of a known configuration can be adopted. The power conversion device 100 has an unillustrated current detection portion which detects a current flowing through the IGBT elements 20 and 30. The current detection portion detects an overcurrent that flows due to a short circuit occurring between the collector electrode 22 and the emitter electrode 24 or a short circuit occurring between the collector electrode 32 and the emitter electrode 34.

For example, when an overcurrent due to a short circuit occurring between the collector electrode 22 and the emitter electrode 24 is detected, the control portion 104 controls the IGBT element 30 of the corresponding semiconductor device 10 not to turn on. Likewise, when an overcurrent due to a short circuit occurring between the collector electrode 32 and the emitter electrode 34 is detected, the control portion 104 controls the IGBT element 20 of the corresponding semiconductor device 10 not to turn on. In the manner as above, even when a short circuit occurs in one of the IGBT elements 20 and 30, the control portion 104 controls the other one of the IGBT elements 20 and 30 so as to restrict a large short-circuit current from flowing by forestalling a short circuit that could occur otherwise between the high-potential power-supply terminal 40 and the low-potential power-supply terminal 42.

A schematic configuration of the semiconductor device 10 will now be described according to FIG. 2 through FIG. 5.

As has been described above, the semiconductor device 10 includes the IGBT elements 20 and 30, the FWD elements 28 and 38, the high-potential power-supply terminal 40, the low-potential power-supply terminal 42, the output terminal 44, and the control terminals 46 including the gate terminals 46g. As are shown in FIG. 2 through FIG. 5, the semiconductor device 10 further includes four heat sinks 50, 52, 54, and 56, a joint portion 58, two terminals 60 and 62, solder 64 as a connection member, and an encapsulation resin body 66.

The IGBT element 20 has the collector electrode 22 on a lower surface in the Z direction and the emitter electrode 24 and the gate electrode 26 on an upper surface opposite to the lower surface.

The first heat sink 50 is disposed adjacent to the lower surface of the IGBT element 20. The collector electrode 22 is electrically and mechanically connected to an inner surface 50a of the first heat sink 50 on a side of the IGBT element 20 via the solder 64. The cathode electrode of the FWD element 28 is also connected to the inner surface 50a of the first heat sink 50.

Figure 2:
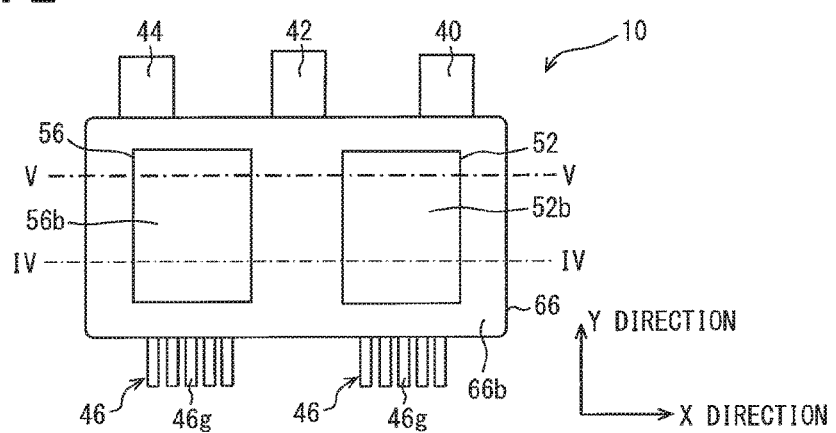
FIG. 2 is a top view schematically showing a configuration of the semiconductor device according to the first embodiment.
Figure 3:
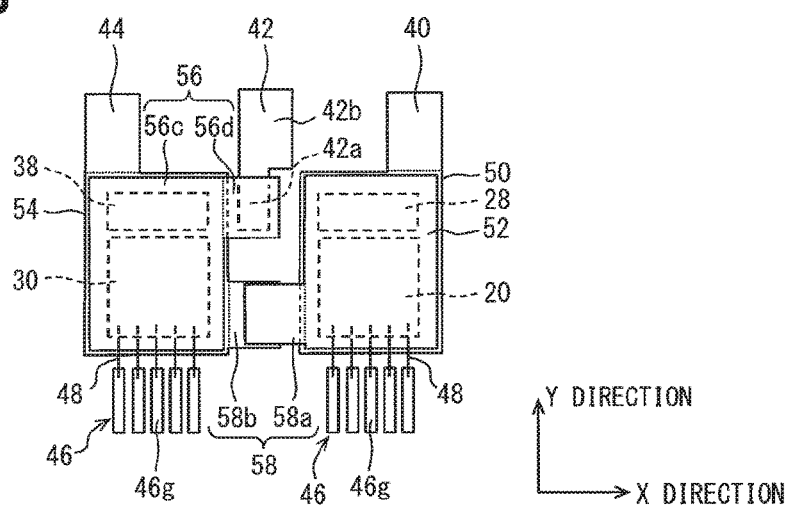
FIG. 3 is a view of the semiconductor device of FIG. 2 when an encapsulation resin body is omitted.
Figure 4:
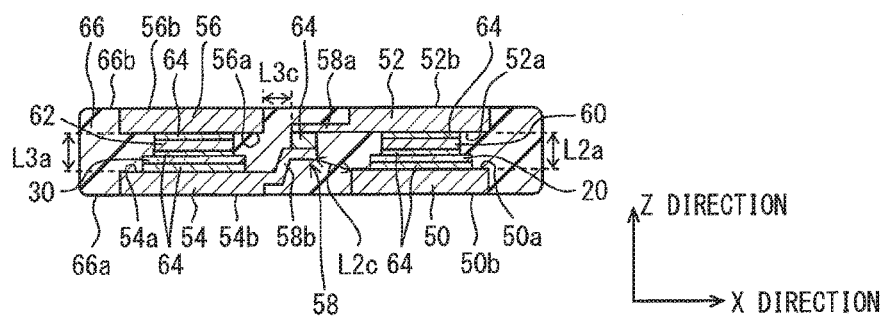
FIG. 4 is a sectional view taken along the line IV-IV of FIG. 2.
Figure 5:
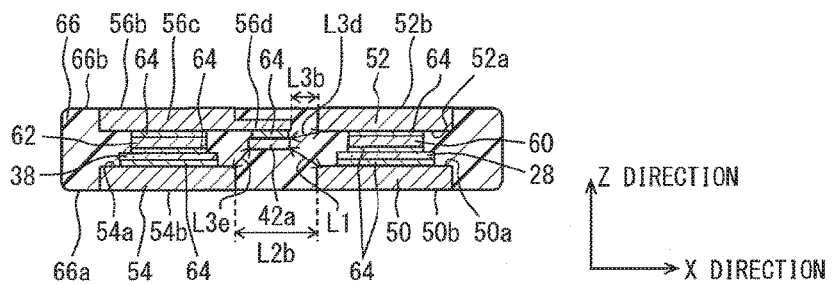
FIG. 5 is a sectional view taken along the line V-V of FIG. 2.

As is shown in FIG. 3, the first heat sink 50 is of a planar rectangular shape and the high-potential power-supply terminal 40 is provided to extend from one side of the rectangle in the Y direction. As are shown in FIG. 2, FIG. 4, and FIG. 5, an outer surface 50b of the first heat sink 50 opposite to the inner surface 50a is exposed from a surface 66a of the encapsulation resin body 66 in the Z direction. Heat generated in the IGBT element 20 and the FWD element 28 can be thus released to an outside from the outer surface 50b of the first heat sink 50. Also, the IGBT element 20 and the FWD element 28 can be electrically connected to the high-potential power-supply terminal 40 via the first heat sink 50. As is shown in FIG. 2, a part of the high-potential power-supply terminal 40 is extracted to the outside from a side surface of the encapsulation resin body 66.

The first terminal 60 is disposed adjacent to the upper surface of the IGBT element 20 so as to oppose the emitter electrode 24 without overlapping the gate electrode 26. The first terminal 60 is electrically and mechanically connected to the emitter electrode 24 via the solder 64. The anode electrode of the FWD element 28 is also connected to the first terminal 60 in a surface which is connected to the emitter electrode 24. The first terminal 60 is furnished with a junction function of electrically connecting the IGBT element 20 and the FWD element 28 to the second heat sink 52 and a function of securing a height to enable wire bonding for the gate electrode 26. In the present embodiment, the first terminal 60 is of a planar rectangular shape so as to overlap the emitter electrode 24 of the IGBT element 20 and the FWD element 28 in the XY plane.

The gate electrode 26 is connected to the gate terminal 46g included in the control terminals 46 via a bonding wire 48. In the present embodiment, as is shown in FIG. 3, two control terminals 46 for a temperature measuring diode, one gate terminal 46g, one current sensing control terminal 46, and one emitter sensing control terminal 46, that is, a total of five control terminals 46 are provided for the IGBT element 20. The current sensing control terminal 46 enables a detection of an overcurrent in the IGBT element 20. The control terminals 46 are disposed so that the IGBT element 20 is located between the control terminals 46 and the high-potential power-supply terminal 40 in the Y direction. In other words, as is shown in FIG. 2, the control terminals 46 are extracted to the outside from a side surface of the encapsulation resin body 66 on an opposite side to the high-potential power-supply terminal 40.

The second heat sink 52 is disposed adjacent to a surface of the first terminal 60 opposite to the IGBT element 20. The first terminal 60 is electrically and mechanically connected to an inner surface 52a of the second heat sink 52 via the solder 64. In other words, the second heat sink 52 is electrically connected to the emitter electrode 24 of the IGBT element 20 and the anode electrode of the FWD element 28 via the terminal 60.

The second heat sink 52 is disposed so as to overlap the first heat sink 50 in large part in the XY plane. In the present embodiment, as is shown in FIG. 3, the second heat sink 52 is of substantially a same planar rectangular shape as the first heat sink 50. Also, the second heat sink 52 has substantially a same thickness as the first heat sink 50. An outer surface 52b of the second heat sink 52 opposite to the inner surface 52a is exposed from a back surface 66b of the encapsulation resin body 66 on an opposite side to the surface 66a. Heat generated in the IGBT element 20 and the FWD element 28 can be thus released to the outside from the outer surface 52b of the second heat sink 52 via the first terminal 60.

The second heat sink 52 is integrally provided with a first joint portion 58a as the joint portion 58. As is shown in FIG. 4, the first joint portion 58a is thinner than the second heat sink 52. Also, the first joint portion 58a is coplanar with the inner surface 52a of the second heat sink 52, and is provided to extend in the X direction toward the IGBT element 30. As is shown in FIG. 3, the first joint portion 58a is also provided to extend from a part of the second heat sink 52 in the Y direction. Hence, a planar shape of the second heat sink 52 including the first joint portion 58a is substantially an L shape.

The IGBT element 30 has the collector electrode 32 on a lower surface in the Z direction and the emitter electrode 34 and the gate electrode 36 on an upper surface in the Z direction. The IGBT element 30 is at a position substantially same as the IGBT element 20 in the Z direction and aligned next to the IGBT element 20 in the X direction. In short, the IGBT elements 20 and 30 are disposed in parallel.

The third heat sink 54 is disposed adjacent to the lower surface of the IGBT element 30. The collector electrode 32 is electrically and mechanically connected to an inner surface 54a of the third heat sink 54 adjacent to the IGBT element 30 via the solder 64. The cathode electrode of the FWD element 38 is also connected to the inner surface 54a of the third heat sink 54.

As is shown in FIG. 3, the third heat sink 54 is of substantially a same planar rectangular shape as the first heat sink 50 and has substantially a same thickness as the first heat sink 50. An outer surface 54b of the third heat sink 54 opposite to the inner surface 54a is exposed from the surface 66a of the encapsulation resin body 66. Heat generated in the IGBT element 30 and the FWD element 38 can be thus released to the outside from the outer surface 54b of the third heat sink 54.

The third heat sink 54 is integrally provided with the output terminal 44. The output terminal 44 is provided to extend from one side of the rectangular third heat sink 54 in the Y direction as does the high-potential power-supply terminal 40. As is shown in FIG. 2, a part of the output terminal 44 is extracted to the outside from the same side surface of the encapsulation resin body 66 from which the high-potential power-supply terminal 40 is also extracted.

The third heat sink 54 is also integrally provided with a second joint portion 58b as the joint portion 58. As is shown in FIG. 4, the second joint portion 58b is thinner than the third heat sink 54. The second joint portion 58b is coupled to the inner surface 54a of the third heat sink 54. The second joint portion 58b has two bent portions in an own longitudinal direction and is provided to extend toward the second heat sink 52. As is shown in FIG. 3, the second joint portion 58b is provided to extend from a part of the third heat sink 54 in the Y direction. Hence, a planar shape of the third heat sink 54 including the second joint portion 58b is substantially an L shape. The second joint portion 58b is electrically and mechanically connected to the first joint portion 58a via the solder 64 in a region in the X direction between the second heat sink 52 and the third heat sink 54.

The second terminal 62 is disposed adjacent to the upper surface of the IGBT element 30 so as to oppose the emitter electrode 34 without overlapping the gate electrode 36. The second terminal 62 is electrically and mechanically connected to the emitter electrode 34 via the solder 64. The anode electrode of the FWD element 38 is also connected to the second terminal 62 in a surface which is connected to the emitter electrode 34. The second terminal 62 is furnished with a junction function of electrically connecting the IGBT element 30 and the FWD element 38 to the fourth heat sink 56 and a function of securing a height to enable wire bonding for the gate electrode 36. In the present embodiment, the second terminal 62 is of a planar rectangular shape so as to overlap the emitter electrode 34 of the IGBT element 30 and the FWD element 38 in the XY plane. Also, the second terminal 62 has substantially the same thickness as the first terminal 60.

The gate electrode 36 is connected to the gate terminal 46g included in the control terminals 46 via the bonding wire 48. In the present embodiment, as is shown in FIG. 3, the two control terminals 46 for a temperature measuring diode, one gate terminal 46g, one current sensing control terminal 46, and one emitter sensing control terminal 46, that is, the total of five control terminals 46 are provided for the IGBT element 30. The current sensing control terminal 46 enables a detection of an overcurrent in the IGBT element 30. The control terminals 46 are disposed for the IGBT element 30 to be sandwiched between the control terminals 46 and the output terminal 44 in the Y direction. In other words, as is shown in FIG. 2, the control terminals 46 are extracted to the outside from a side surface of the encapsulation resin body 66 opposite to the output terminal 44.

The fourth heat sink 56 is disposed adjacent to a surface of the second terminal 62 opposite to the IGBT element 30. An inner surface 56a of the fourth heat sink 56 is electrically and mechanically connected to the second terminal 62 via the solder 64. In other words, the fourth heat sink 56 is electrically connected to the emitter electrode 34 of the IGBT element 30 and the anode electrode of the FWD element 38 via the second terminal 62.

The fourth heat sink 56 is disposed so as to overlap the third heat sink 54 in large part in the XY plane. In the present embodiment, as is shown in FIG. 3, the fourth heat sink 56 is of substantially a same planar rectangular shape as the third heat sink 54. Also, the fourth heat sink 56 has substantially the same thickness as the third heat sink 54. An outer surface 56b of the fourth heat sink 56 opposite to the inner surface 56a is exposed from the back surface 66b of the encapsulation resin body 66. Heat generated in the IGBT element 30 and the FWD element 38 can be thus released to the outside from the outer surface 56b of the fourth heat sink 56 via the second terminal 62.

The fourth heat sink 56 includes a main body portion 56c having the inner surface 56a and the outer surface 56b described above, and an extended portion 56d provided to extend from a side surface of the main body portion 56c in the X direction toward the IGBT element 20 and encapsulated in the encapsulation resin body 66. As is shown in FIG. 5, the extended portion 56d is thinner than the main body portion 56c. The extended portion 56d, is coplanar with the inner surface 56a of the main body portion 56c, and is provided to extend toward the IGBT element 20. Also, as is shown in FIG. 3, the extended portion 56d is provided to extend from a part of the fourth heat sink 56 in the Y direction without overlapping the joint portion 58. Hence, a planar shape of the fourth heat sink 56 including the extended portion 56d is substantially an L shape.

The low-potential power-supply terminal 42 has an encapsulated portion 42a electrically connected to the fourth heat sink 56 and encapsulated in the encapsulated resin body 66, and an exposed portion 42b provided to extend from the encapsulated portion 42a in a same direction as the high-potential power-supply terminal 40 extends and exposed to the outside of the encapsulation resin body 66. In other words, the exposed portion 42b is exposed to the outside from the same side surface of the encapsulation resin body 66 from which the high-potential power-supply terminal 40 and the output terminal 44 are exposed.

The low-potential power-supply terminal 42 is disposed in the X direction in a region between the second heat sink 52 and the third heat sink 54, that is, in a region in which the second heat sink 52 and the third heat sink 54 are connected by the joint portion 58. In the present embodiment, the low-potential power-supply terminal 42 is entirely disposed in the region between the second heat sink 52 and the third heat sink 54.

As is shown in FIG. 5, the encapsulated portion 42a is disposed on a side of the extended portion 56d adjacent to the IGBT element 30. The encapsulated portion 42a is electrically and mechanically connected to the extended portion 56d via the solder 64.

The IGBT elements 20 and 30, the FWD elements 28 and 38, a part of the high-potential power-supply terminal 40, the encapsulated portion 42a of the low-potential power-supply terminal 42, a part of the output terminal 44, a part of the control terminals 46, the respective heat sinks 50, 52, 54, and 56 except for the outer surfaces 50b, 52b, 54b, and 56b, the joint portion 58, and the respective terminals 60 and 62 are integrally encapsulated in the encapsulation resin body 66. In the present embodiment, as is shown in FIG. 2, the encapsulation resin body 66 is of a planar rectangular shape and main terminals, that is, the high-potential power-supply terminal 40, the low-potential power-supply terminal 42, and the output terminal 44 are extracted from one of side surfaces substantially parallel to the X direction while the control terminals 46 are extracted from the other side surface.

The first heat sink 50 and the third heat sink 54 are cut together with the encapsulation resin body 66. The outer surface 50b of the first heat sink 50 and the outer surface 54b of the third heat sink 54 are positioned in a same plane and substantially coplanar with the surface 66a of the encapsulation resin body 66. The second heat sink 52 and the fourth heat sink 56 are also cut together with the encapsulation rein body 66. The outer surfaces 52b of the second heat sink 52 and the outer surface 56b of the fourth heat sink 56 are positioned in a same plane and substantially coplanar with the back surface 66b of the encapsulation resin body 66.

The semiconductor device 10 configured as above forms so-called a 2-in-1 package including the two IGBT elements 20 and 30. The heat sinks 50, 52, 54, and 56 are present on both sides of the respective IGBT elements 20 and 30 in the Z direction. Hence, heat in the IGBT elements 20 and 30 can be released to the both sides.

In a portion forming the upper arm portion 12, components are disposed sequentially in the Z direction from the side of the surface 66a in the order as follows: the first heat sink 50, the solder 64, the IGBT element 20, the solder 64, the first terminal 60, the solder 64, and the second heat sink 52. Meanwhile, in a portion forming the lower arm portion 14, components are disposed sequentially in the Z direction from the side of the surface 66a in the order as follows: the third heat sink 54, the solder 64, the IGBT element 30, the solder 64, the second terminal 62, the solder 64, and the fourth heat sink 56. In short, components are aligned in the Z direction in the same manner in the upper arm portion 12 and the lower arm portion 14.

A relation among the respective components forming the semiconductor device 10 in terms of distances will now be described according to FIG. 4 and FIG. 5.

Herein, in the encapsulation resin body 66, a portion at same potential (P potential) as the high-potential power-supply terminal 40 is defined as a first potential portion, a portion at same potential (N potential) as the low-potential power-supply terminal 42 as a second potential portion, and a portion at same potential (O potential) as the output terminal 44 as a third potential portion. Hereinafter, the first potential portion is referred to as a P potential portion, the second potential portion as an N potential portion, and the third potential portion as an O potential portion.

As has been described, the low-potential power-supply terminal 42 is positioned in the X direction in a region between the second heat sink 52 and the third heat sink 54, and the low-potential power-supply terminal 42 is in closer proximity to the first heat sink 50 than in the related art. The encapsulated portion 42a is connected to the extended portion 56d on the side of the IGBT element 30. Hence, as is shown in FIG. 5, a distance between opposing portions of the encapsulated portion 42a and the first heat sink 50 is a shortest distance L1 between opposing portions of the P potential portion and the N potential portion via the encapsulation resin body 66.

An example of the opposing portions of the P potential portion and the O potential portion via the encapsulation resin body 66 is, as shown in FIG. 4, opposing portions of the first heat sink 50 (P potential) and the second heat sink 52 (O potential) having an opposing distance of L2a. Another example is, as shown in FIG. 5, opposing portions of the first heat sink 50 (P potential) and the third heat sink 54 (O potential) having an opposing distance of L2b. Still another example is, as is shown in FIG. 4, opposing portions of the first heat sink 50 (P potential) and the second joint portion 58b (O potential) having an opposing distance of L2c.

An example of the opposing portions of the N potential portion and the O potential portion via the encapsulation resin body 66 is, as shown in FIG. 4, opposing portions of the third heat sink 54 (O potential) and the fourth heat sink 56 (N potential) having an opposing distance of L3a. Another example is, as is shown in FIG. 5, opposing portions of the fourth heat sink 56 (N potential) and the second heat sink 52 (O potential) having an opposing distance of L3b. Still another example is, as is shown in FIG. 4, opposing portions of the first joint portion 58a (O potential) and the fourth heat sink 56 (N potential) having an opposing distance of L3c. Still another example is, as is shown in FIG. 5, opposing portions of the encapsulated portion 42a (N potential) and the second heat sink 52 (O potential) having an opposing distance of L3d. Still another example is, as is shown in FIG. 5, opposing portions of the encapsulated portion 42a (N potential) and the third heat sink 54 (O potential) having an opposing distance of L3e. The term, "an opposing distance", referred to in the present embodiment means a minimum value of a distance between the opposing portions, that is to say, a shortest distance between the opposing portions.

At least one of an opposing distance of the P potential portion and the O potential portion and an opposing distance of the N potential portion and the O potential portion is made shorter than the shortest distance L1 described above. In other words, at least one of the shortest distance between the P potential portion and the O potential portion and the shortest distance between the N potential portion and the O potential portion is made shorter than the shortest distance L1 described above. In the present embodiment, the opposing distances L2c, L3b, L3c, L3d, and L3e are made shorter than the shortest distance L1.

An example of a manufacturing method of the semiconductor device 10 will now be described briefly.

Firstly, a preparation process is performed, in which the IGBT elements 20 and 30, the FWD elements 28 and 38, the respective heat sinks 50, 52, 54, and 56, and the respective terminals 60 and 62 are prepared. In the present embodiment, the first heat sink 50 integrally provided with the high-potential power-supply terminal 40 is prepared. Also, the second heat sink 52 integrally provided with the first joint portion 58a and the third heat sink 54 integrally provided with the second joint portion 58b and the output terminal 44 are prepared. Further, the fourth heat sink 56 having the extended portion 56d is prepared.

Subsequently, a pre-process up to molding of the encapsulation resin body 66 is performed. The pre-process is a connection process in which after respective components forming the upper arm portion 12 are electrically connected and respective components forming the lower arm portion 14 are electrically connected, the upper arm portion 12 and the lower arm portion 14 are connected by the joint portion 58. The pre-process can adopt the process described in JP-A-2012-235081 (US 2014/0035112A1 is incorporated herein by reference) and a description is omitted herein.

Subsequently, a molding process is performed, in which a structure formed as an outcome of the connection process is placed in a die and the encapsulation resin body 66 is molded by filling a cavity in the die with resin. In the present embodiment, the encapsulation resin body 66 is molded by a transfer molding method using epoxy resin. The encapsulation resin body 66 is molded so as to cover the outer surfaces 50b, 52b, 54b, and 56b of the respective heat sinks 50, 52, 54, and 56.

Subsequently, a cutting process is performed. In the cutting process, the encapsulation resin body 66 is pressed from the both sides in the X direction while the side surfaces of the encapsulation resin body 66 are held in vacuum with an unillustrated pressing jig. In the state as above, the encapsulation resin body 66 is cut on a side of the surface 66a together with the first heat sink 50 and the third heat sink 54. Subsequently, the encapsulation resin body 66 is cut on a side of the back surface 66b together with the second heat sink 52 and the fourth heat sink 56.

As the result of the cutting as above, the outer surfaces 50b, 52b, 54b, and 56b of the respective heat sinks 50, 52, 54, and 56 are exposed from the encapsulation resin body 66. In the present embodiment, the outer surface 50b of the first heat sink 50 and the outer surface 54b of the third heat sink 54 become substantially coplanar with the surface 66a on the periphery while the outer surface 52b of the second heat sink 52 and the outer surface 56b of the fourth heat sink 56 become substantially coplanar with the back surface 66b on the periphery.

The semiconductor device 10 is obtained by cutting out unillustrated tie bars connecting the heat sinks and the like.

An effect of the semiconductor device 10 of the present embodiment will now be described.

In the configuration of the present embodiment to electrically connect the second heat sink 52 and the third heat sink 54 by the joint portion 58, the low-potential power-supply terminal 42 as the second power-supply terminal is disposed in a region between the second heat sink 52 and the third heat sink 54. That is to say, the low-potential power-supply terminal 42 is disposed in a region which is necessary for the connection by the joint portion 58 but a dead space for the other components in the related art. Consequently, a physical size of the semiconductor device 10 in the X direction can be reduced.

Figure 6:
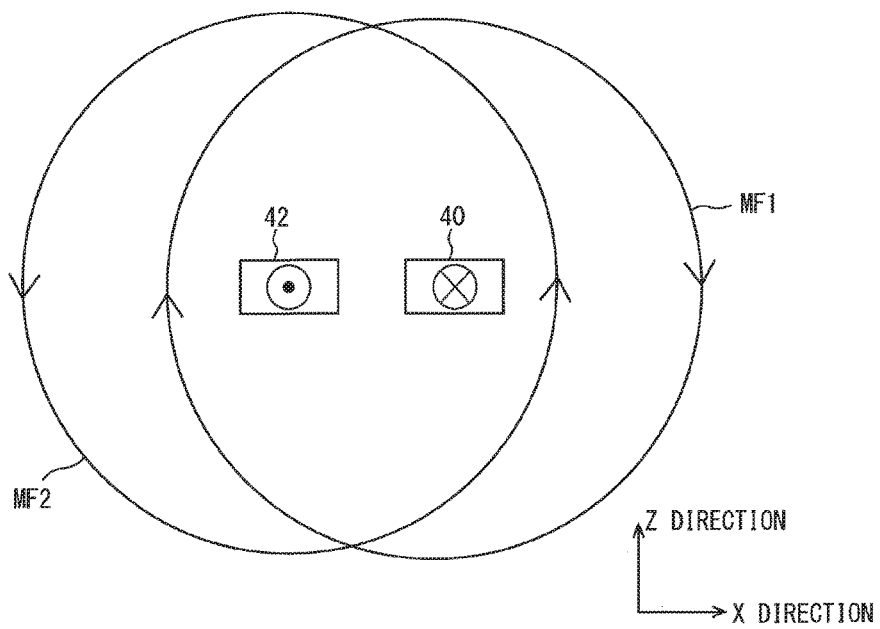
FIG. 6 is a view showing an effect of cancelling out magnetic fluxes.

As is shown in FIG. 6, a current flows in opposite directions in the high-potential power-supply terminal 40 as the first power-supply terminal and the low-potential power-supply terminal 42. In FIG. 6, a current flows in the high-potential power-supply terminal 40 from front to back on the sheet surface and a clockwise magnetic flux MF1 is induced around the high-potential power-supply terminal 40. On the other hand, a current flows in the low-potential power-supply terminal 42 from back to front on the sheet surface and a counterclockwise magnetic flux MF2 is induced around the low-potential power-supply terminal 42. In the present embodiment, the low-potential power-supply terminal 42 is disposed next to the high-potential power-supply terminal 40, that is, the power-supply terminals 40 and 42 are disposed in close proximity to each other. Hence, an effect of cancelling out the magnetic fluxes can be enhanced. Consequently, parasitic inductance is reduced and hence a surge voltage occurring when the IGBT elements 20 and 30 switch can be reduced.

When a surge voltage is reduced while reducing a physical size of the semiconductor device 10, the low-potential power-supply terminal 42 has to be disposed in the X direction in a region between the second heat sink 52 and the third heat sink 54, which brings the encapsulated portion 42a in closer proximity to the first heat sink 50. In short, the P potential portion and the N potential portion are in closer proximity to each other. The present embodiment takes such positional relations into consideration and locations of the P potential portion, the N potential portion, and the O potential portion are determined in such a manner that at least one of the shortest distance between the P potential portion and the O potential portion and the shortest distance between the N potential portion and the O potential portion becomes shorter than the shortest distance L1 between the P potential portion and the N potential portion. Hence, even when insulation performance of the encapsulation resin body 66 deteriorates with aging or the like, a short circuit is more likely to occur between the P potential portion and the O potential portion or between the N potential portion and the O potential portion than between the P potential portion and the N potential portion. Accordingly, a large short-circuit current that flows due to a short-circuit occurring between the P potential portion and the N potential portion via the encapsulation resin body 66, that is, when the high-potential power-supply terminal 40 and the low-potential power-supply terminal 42 are electrically connected to each other, can be restricted. Consequently, the fuse 110 can be restricted from opening with deterioration of the insulation performance of the encapsulation resin body 66.

In the present embodiment, in the event of a short circuit between the collector electrode 22 and the emitter electrode 24 of the IGBT element 20 or a short circuit between the collector electrode 32 and the emitter electrode 34 of the IGBT element 30, the IGBT element other than the failing IGBT element is controlled so as not to turn on. Hence, even when a short circuit occurs between the P potential portion and the O potential portion or between the N potential portion and the O potential portion, a large short-circuit current that flows due to a short circuit occurring between the P potential portion and the N potential portion can be restricted.

More specifically, the opposing distance L2c between the second joint portion 58b and the first heat sink 50 and the opposing distance L3c between the first joint portion 58a and the fourth heat sink 56 are made shorter than the shortest distance L1 between the encapsulated portion 42a and the first heat sink 50. Owing to the configuration as above, although the encapsulated portion 42a of the low-potential power-supply terminal 42 is disposed on the side of the extended portion 56d of the fourth heat sink 56 adjacent to the IGBT element 30 and the encapsulated portion 42a is in closer proximity to the first heat sink 50, a short circuit occurring between the P potential portion and the N potential portion can be restricted. For the control portion 104 to have a short circuit protection function, at least one of the opposing distances L2c and L3c is made shorter than the shortest distance L1.

By providing the extended portion 56d, the opposing distance L3b between the fourth heat sink 56 (extended portion 56d) and the second heat sink 52 is made shorter than the shortest distance L1. The configuration as above also can restrict a short circuit occurring between the P potential portion and the N potential portion while the encapsulated portion 42a is disposed on the side of the extended portion 56d adjacent to the IGBT element 30.

As is shown in FIG. 5, the encapsulated portion 42a is at a position closer to the second heat sink 52 than to the first heat sink 50 in the Z direction. Herein, the opposing distance L3d between the encapsulated portion 42a and the second heat sink 52 is made shorter than the shortest distance L1. The configuration as above also can restrict a short circuit occurring between the P potential portion and the N potential portion while the encapsulated portion 42a is disposed on the side of the extended portion 56d adjacent to the IGBT element 30.

In order to restrict a short circuit occurring between the P potential portion and the N potential portion via the encapsulated resin body 66 when the insulation performance of the encapsulation resin body 66 deteriorates, at least one of a distance between the opposing portions of the P potential portion and the O potential portion and a distance between the opposing portions of the N potential portion and the O potential portion is made shorter than the shortest distance L1 described above. The opposing regions having a distance shorter than the shortest distance L1 are not particularly limited.

Second Embodiment

In the present embodiment, a description of portions common with the semiconductor device 10 of the first embodiment above is omitted.

Figure 7:
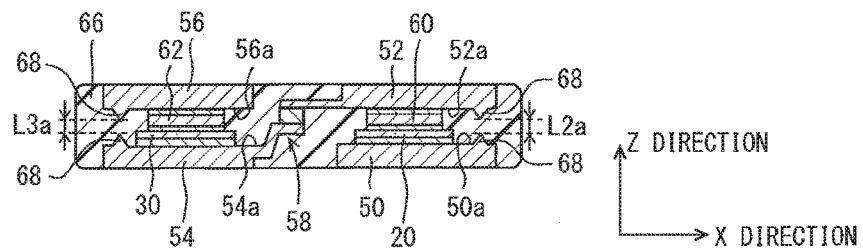
FIG. 7 is a sectional view corresponding to FIG. 4 and schematically showing a configuration of a semiconductor device according to a second embodiment.
Figure 8:
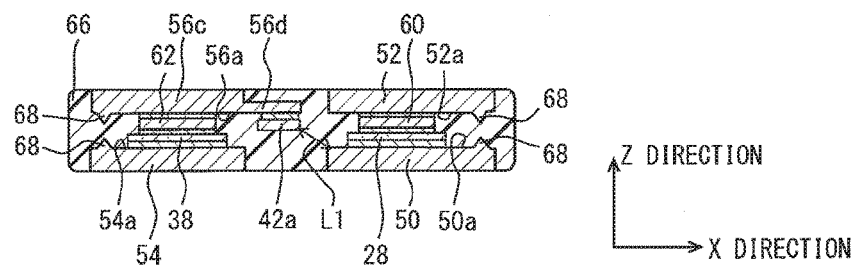
FIG. 8 is a sectional view corresponding to FIG. 5 and schematically showing the configuration of the semiconductor device according to the second embodiment.

In the present embodiment, as are shown in FIG. 7 and FIG. 8, respective heat sinks 50, 52, 54, and 56 have protrusion portions 68 protruding in a Z direction on inner surfaces 50a, 52a, 54a, and 56a. The protrusion portions 68 are formed, for example, by pressing. By providing the protrusion portions 68, opposing distances between heat sinks having the protrusion portions 68, more specifically, opposing distances L2a and L3a between the protrusion portions 68, are made shorter than a shortest distance L1 between an encapsulated portion 42a and the first heat sink 50.

By providing the protrusion portions 68 as above, opposing distances between the heat sinks having the protrusion portions 68 can be made shorter than the shortest distance L1. The configuration as above also can restrict a short circuit occurring between a P potential portion and an N potential portion with deterioration of insulation performance of an encapsulation resin body 66.

It is sufficient to provide the protrusion portion 68 to at least one of the heat sinks 50, 52, 54, and 56. For example, it may be configured in such a manner that the protrusion portion 68 is provided to the first heat sink 50 alone to make the opposing distance L2a from a top of the protrusion portion 68 of the first heat sink 50 to the second heat sink 52 shorter than the shortest distance L1.

FIG. 7 and FIG. 8 show a case where the protrusion portions 68 are provided on the peripheries of IGBT elements 20 and 30 and also on the peripheries of FWD elements 28 and 38. It should be appreciated, however, that the present disclosure is not limited to the case described above as to where the protrusion portions 68 are disposed. The protrusion portions 68 may be disposed on the inner surfaces 50a, 52a, 54a, and 56a so as to oppose each other in the Z direction via the encapsulation resin body 66.

A sectional shape of the protrusion portions 68 along a ZX plane is not limited to substantially a triangular shape. Besides the protrusion portions 68 of substantially a triangular shape, the protrusion portions 68 of substantially a semi-circular shape or substantially a rectangular shape can be also adopted.

Third Embodiment

In the present embodiment, a description of portions common with the semiconductor device 10 of the first embodiment above is omitted.

Figure 9:
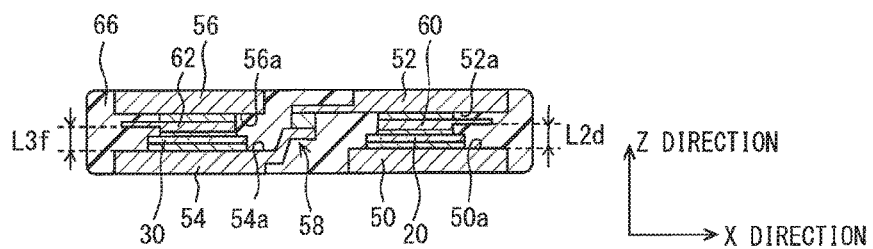
FIG. 9 is a sectional view corresponding to FIG. 4 and schematically showing a configuration of a semiconductor device according to a third embodiment.
Figure 10:
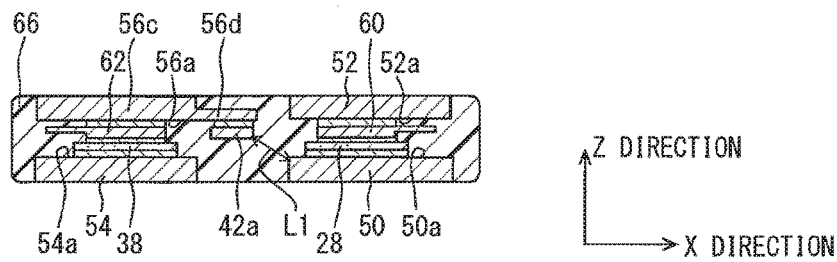
FIG. 10 is a sectional view corresponding to FIG. 5 and schematically showing the configuration of the semiconductor device according to the third embodiment.

In the present embodiment, as are shown in FIG. 9 and FIG. 10, respective terminals 60 and 62 are extended in an X direction more to outside of corresponding IGBT elements 20 and 30. In other words, the respective terminals 60 and 62 have extended portions which extend in the X direction to the outside of the corresponding IGBT elements 20 and 30. In short, the first terminal 60 and the second terminal 62 correspond to an extended terminal.

In a case shown in FIG. 9 and FIG. 10, the first terminal 60 is provided to extend in the X direction on an opposite side to the IGBT element 30. The first terminal 60, which is provided to extend to the outside of the IGBT element 20 as described above, is also provided in such a manner that an encapsulation resin body 66 is interposed between the first terminal 60 and a guard ring provided on the periphery of an emitter electrode 24 of the IGBT element 20. In other words, the first terminal 60 is thinner in a portion disposed on the outside of the emitter electrode 24 than in a portion opposing the emitter electrode 24 and has a longer distance along a Z direction from the IGBT element 20 in the former portion than in the latter portion.

The second terminal 62 is configured in the same manner as the first terminal 60. The second terminal 62 is provided to extend in the X direction on an opposite side to the IGBT element 20. The second terminal 62, which is provided to extend to the outside of the IGBT element 30 as described above, is also provided in such a manner that the encapsulation resin body 66 is interposed between the second terminal 62 and a guard ring provided on the periphery of an emitter electrode 34 of the IGBT element 30. In other words, the second terminal 62 is thinner in a portion disposed on the outside of the emitter electrode 34 than in a portion opposing the emitter electrode 34 and has a longer distance along the Z direction from the IGBT element 30 in the former portion than in the latter portion.

By extending the respective terminals 60 and 62, an opposing distance $L2d$ between the first terminal 60 (O potential) and a first heat sink 50 (P potential) and an opposing distance $L3f$ between the second terminal 62 (N potential) and a third heat sink 54 (O potential) become shorter than a shortest distance $L1$ between an encapsulated portion 42a and the first heat sink 50. The configuration as above also can restrict a short circuit occurring between the P potential portion and the N potential portion with deterioration of insulation performance of the encapsulation resin body 66.

The above has described a case where both of the first terminal 60 and the second terminal 62 are extended. It should be appreciated, however, that one of the two terminals 60 and 62 may be extended. Further, the extended terminal is not limited to the first terminal 60 and the second terminal 62. For example, the extended terminal may be disposed between the IGBT element 20 and the first heat sink 50 to make an opposing distance between the extended terminal and a second heat sink 52 shorter than the shortest distance $L1$. Further, the extended terminal may be disposed between the IGBT element 30 and the third heat sink 54 to make an opposing distance between the extended terminal and a fourth heat sink 56 shorter than the shortest distance $L1$.

Fourth Embodiment

In the present embodiment, a description of portions common with the semiconductor device 10 of the first embodiment above is omitted.

Figure 11:
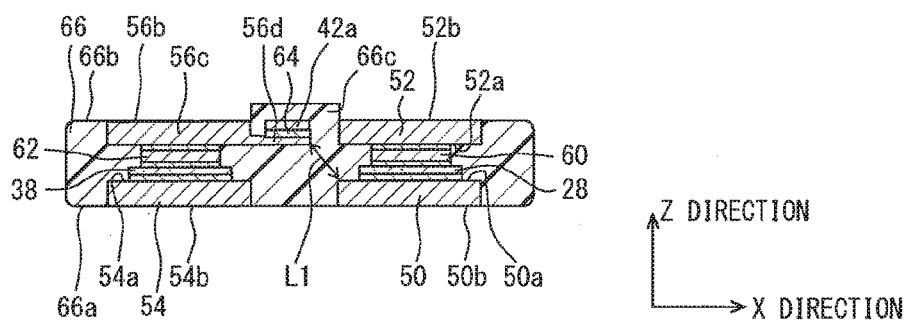
FIG. 11 is a sectional view corresponding to FIG. 5 and schematically showing a configuration of a semiconductor device according to a fourth embodiment.

In the present embodiment, as is shown in FIG. 11, an encapsulated portion 42a of a low-potential power-supply terminal 42 is disposed on an opposite side to an IGBT element 30 with respect to an extended portion 56d of a fourth heat sink 56. The encapsulated portion 42a has a positional relation such that a surface on the opposite side to solder 64 is substantially coplanar with an outer surface 52b of a second heat sink 52 and an outer surface 56b of a fourth heat sink 56.

Figure 12:
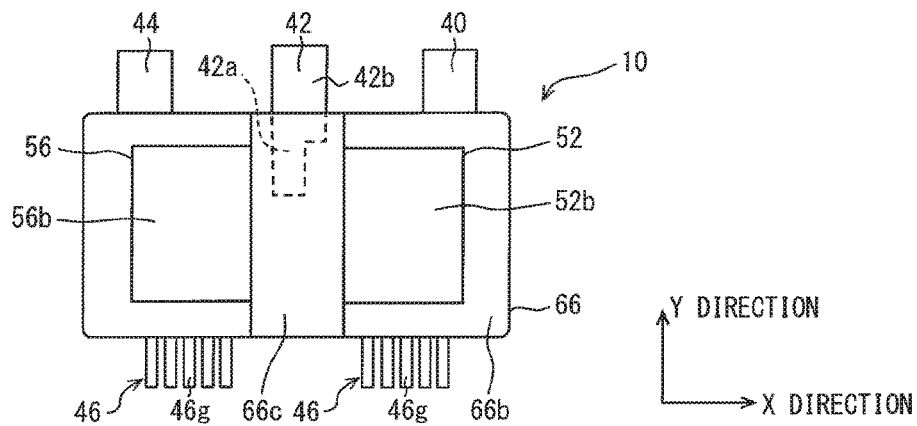
FIG. 12 is a top view corresponding to FIG. 2 and showing the semiconductor device according to the fourth embodiment.

As are shown in FIG. 11 and FIG. 12, an encapsulation resin body 66 has a projected portion 66c on a side of a back surface 66b so as to cover the encapsulated portion 42a disposed as above. In the present embodiment, for the projected portion 66c to cover an entire region in an X direction between the second heat sink 52 and the fourth heat sink 56, the projected portion 66c is provided across the back surface 66b of a planar rectangular shape from one side to an opposing side in a Y direction. The projected portion 66c can be formed, for example, by cutting the encapsulation resin body 66 so as to leave the projected portion 66c.

By disposing the encapsulated portion 42a on the side opposite to the IGBT element 30 with respect to the extended portion 56d, opposing portions of the extended portion 56d and a first heat sink 50 have a shortest distance $L1$ between a P potential portion and an N potential portion. Hence, the shortest distance $L1$ can be longer in the present embodiment than in the first embodiment above. The configuration as above can restrict a short circuit occurring between the P potential portion and the N potential portion with deterioration of insulation performance of the encapsulation resin body 66. In the present embodiment, too, at least one of a shortest distance between the P potential portion and an O potential portion and a shortest distance between the N potential portion and the O potential portion is made shorter than the shortest distance $L1$.

Further, the encapsulated portion 42a, which is disposed on the side opposite to the IGBT element 30 with respect to the extended portion 56d, is covered with the projected portion 66c of the encapsulation resin body 66. A creeping distance between the O potential portion and the N potential portion can be thus increased and hence a semiconductor device 10 can be reduced in size in the X direction.

A range within which the projected portion 66c is provided is not limited to the case described above. It is sufficient to provide the projected portion 66c so as to cover the encapsulated portion 42a. Hence, the projected portion 66c may be provided only on the periphery of the encapsulated portion 42a.

The above has described a case where the encapsulation resin body 66 has the projected portion 66c. It should be appreciated, however, that the semiconductor device 10 may be formed by disposing the encapsulated portion 42a on the side opposite to the IGBT element 30 with respect to the extended portion 56d without providing the projected portion 66c.

While the embodiments of the present disclosure have been described, it should be appreciated that the present disclosure is not limited to the embodiments described above and can be implemented in various modifications within the scope of the present disclosure. In addition, the respective embodiments above can be combined appropriately unless inconsistency arises.

The above has described a case where the IGBT element 20 is the first switching element, the IGBT element 30 is the second switching element, the high-potential power-supply terminal 40 is the first power-supply terminal, and the low-potential power-supply terminal 42 is the second power-supply terminal. However, the IGBT element 30 may be the first switching element, the IGBT element 20 may be the second switching element, the low-potential power-supply terminal 42 may be the first power-supply terminal, and the high-potential power-supply terminal 40 may be the second power-supply terminal. In such a case, the second heat sink 52 corresponds to the third heat sink and the third heat sink 54 corresponds to the second heat sink.

The above has described a case where the joint portion 58 includes the first joint portion 58a provided to the second heat sink 52 and the second joint portion 58b provided to the third heat sink 54. However, it is sufficient to provide the joint portion 58 to at least one of the second heat sink 52 and the third heat sink 54. For example, the joint portion 58 may be provided to the second heat sink 52 alone. In such a case, the joint portion 58 is connected to the inner surface 54a or a side surface of the third heat sink 54. Likewise, the joint portion 58 may be provided to the third heat sink 54 alone.

The above has described a case where the first joint portion 58a and the second joint portion 58b are connected in the Z direction via the solder 64. However, the present disclosure may adopt a configuration in which the first joint portion 58a and the second joint portion 58b are connected in the X direction via the solder 64.

The above has described a case where the semiconductor device 10 includes the terminals 60 and 62. However, the present disclosure may adopt a configuration having neither the terminal 60 nor 62.

The above has described a case where the outer surfaces 50b and 54b are exposed from the surface 66a and the outer surfaces 52b and 56b are exposed from the back surface 66b by cutting the encapsulation resin body 66 together with the respective heat sinks 50, 52, 54, and 56. However, the outer surfaces 50b, 52b, 54b, and 56b may be exposed by appropriate methods other than the cutting. Further, the present disclosure may adopt a configuration in which at least one of the outer surfaces 50b, 52b, 54b, and 56b is covered with the encapsulation resin body 66 and unexposed to the outside.

The above has described a case where the fourth heat sink 56 has the extended portion 56d and the low-potential power-supply terminal 42 is connected to the extended portion 56d. However, the present disclosure may adopt a configuration in which the fourth heat sink 56 does not have the extended portion 56d and the low-potential power-supply terminal 42 is connected to an inner surface 56a of a main body portion 56c.

The invention claimed is:

1. A semiconductor device comprising a first switching element, as a switching element forming an upper arm, having electrodes on upper and lower surfaces and a second switching element, as a switching element forming a lower arm, having electrodes on upper and lower surfaces, the first switching element and the second switching element being disposed in parallel and controlled in such a manner that when a short circuit occurs between the electrodes of one of the first switching element and the second switching element, the other one of the first switching element and the second switching element is restricted from being turned on, the semiconductor device further comprising:
   a plurality of heat sinks electrically connected to the switching elements, including,
      a first heat sink electrically connected to the electrode on the lower surface of the first switching element,
      a second heat sink electrically connected to the electrode on the upper surface of the first switching element,
      a third heat sink electrically connected to the electrode on the lower surface of the second switching element, and
      a fourth heat sink electrically connected to the electrode on the upper surface of the second switching element,
   a joint portion provided to at least one of the second heat sink and the third heat sink to electrically join the second heat sink and the third heat sink;
   an encapsulation resin body in which the first and second switching elements, the first through fourth heat sinks, and the joint portion are integrally encapsulated;
   a first power-supply terminal extending from the first heat sink in a direction orthogonal to both of an alignment direction in which the first switching element and the second switching element are aligned and a thickness direction of the first switching element and exposed to an outside of the encapsulation resin body;
   an external connection output terminal extending from the third heat sink in a same direction as the first power-supply terminal extends and exposed to the outside of the encapsulation resin body; and
   a second power-supply terminal having an encapsulated portion electrically connected to an extended portion of the fourth heat sink and encapsulated in the encapsulation resin body and an exposed portion extending from the encapsulated portion in a same direction as the first power-supply terminal extends and exposed to the outside of the resin encapsulation body, the second power-supply terminal being connected to a power supply together with the first power-supply terminal, the extended portion of the fourth heat sink extending from a main body portion of the fourth heat sink in the alignment direction toward the first switching element and encapsulated in the encapsulated resin body, wherein:
   the second power-supply terminal is disposed in the alignment direction in a region between the first power-supply terminal and the output terminal and between the second heat sink and the third heat sink;
   in the encapsulation resin body, a portion having a same potential as the first power-supply terminal is referred to a first potential portion, a portion having a same potential as the second power-supply terminal is referred to a second potential portion, and a portion having a same potential as the output terminal is referred to as a third potential portion, at least one of a shortest distance between the first potential portion and the third potential portion and a shortest distance between the second potential portion and the third potential portion is shorter than a shortest distance between the first potential portion and the second potential portion;
   the joint portion and a connecting portion between the encapsulated portion of the second power supply terminal and the extended portion of the fourth heat sink are disposed in another region extending between the second heat sink and the third heat sink in the alignment direction and between edges of opposite ends of the second and third heat sinks in the direction orthogonal to both of the alignment direction and the thickness direction of the first switching element.

2. The semiconductor device according to claim 1, wherein:
   the encapsulated portion of the second power-supply terminal is disposed on a side of the fourth heat sink, the side being adjacent to the second switching element, and connected to the fourth heat sink; and
   the joint portion extends in the alignment direction, and at least one of a shortest distance between the joint portion and the first heat sink and a shortest distance between the joint portion and the fourth heat sink is shorter than a shortest distance between the encapsulated portion and the first heat sink.

3. The semiconductor device according to claim 1, wherein:
   a surface of the main body portion of the fourth heat sink on an opposite side to the second switching element is exposed from the encapsulation resin body;
   the encapsulated portion of the second power-supply terminal is disposed on a side of the extended portion, the side being adjacent to the second switching element, and connected to the extended portion; and
   a shortest distance between the extended portion and the second heat sink is shorter than a shortest distance between the encapsulated portion and the first heat sink.

4. The semiconductor device according to claim 1, wherein:
   the encapsulated portion of the second power-supply terminal is at a position closer to the second heat sink than to the first heat sink in the thickness direction; and
   a shortest distance between the encapsulated portion and the second heat sink is shorter than a shortest distance between the encapsulated portion and the first heat sink.

5. The semiconductor device according to claim 1, wherein:
   at least one of the first heat sink, the second heat sink, the third heat sink, and the fourth heat sink has a protrusion portion protruding in the thickness direction on an inner surface adjacent to a corresponding one of the switching elements; and
   at least one of an opposing distance between the first heat sink and the second heat sink and an opposing distance between the third heat sink and the fourth heat sink in presence of the protrusion portion is shorter than a shortest distance between the encapsulated portion and the first heat sink.

6. The semiconductor device according to claim 1, further comprising:
   an extended terminal interposed in at least one of a space between the first switching element and the first heat sink, a space between the first switching element and the second heat sink, a space between the second switching element and the third heat sink, and a space between the second switching element and the fourth heat sink to serve as an electrical joint, and extending in the alignment direction more to outside of a corresponding one of the switching elements to be joined,
   wherein a shortest distance between the extended terminal and a corresponding one of the heat sinks opposing the extended terminal via the corresponding one of the switching elements is shorter than a shortest distance between the encapsulated portion and the first heat sink.

7. The semiconductor device according to claim 1, wherein:
   a surface of the main body portion of the fourth heat sink opposite to the second switching element is exposed from the encapsulation resin body; and
   the encapsulated portion of the second power-supply terminal is disposed on an opposite side to the second switching element with respect to the extended portion and connected to the extended portion.

8. The semiconductor device according to claim 7, wherein:
   the encapsulation resin body has a projected portion provided so as to cover the encapsulated portion.

9. The semiconductor device according to claim 1, wherein:
   an entire width of the second power-supply terminal is located in the region between the second heat sink and the third heat sink in the alignment direction.

\* \* \* \* \*